(12) United States Patent
Stellacci et al.

(10) Patent No.: US 8,383,339 B2
(45) Date of Patent: Feb. 26, 2013

(54) LIQUID SUPRAMOLECULAR NANOSTAMPING (LISUNS)

(75) Inventors: Francesco Stellacci, Somerville, MA (US); Arum Amy Yu, Revere, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 635 days.

(21) Appl. No.: 12/438,924

(22) PCT Filed: Aug. 23, 2007

(86) PCT No.: PCT/US2007/018592
§ 371 (c)(1),
(2), (4) Date: Dec. 2, 2009

(87) PCT Pub. No.: WO2008/027262
PCT Pub. Date: Mar. 6, 2008

(65) Prior Publication Data
US 2010/0105796 A1   Apr. 29, 2010

Related U.S. Application Data

(60) Provisional application No. 60/840,434, filed on Aug. 28, 2006.

(51) Int. Cl.
*C12Q 1/68* (2006.01)
*G01N 33/53* (2006.01)
*C07H 21/00* (2006.01)
(52) U.S. Cl. ............... 435/6.1; 435/7.1; 536/22.1
(58) Field of Classification Search ............ 435/6.1; 536/23.1, 24.3
See application file for complete search history.

(56) References Cited

U.S. PATENT DOCUMENTS

| | | | |
|---|---|---|---|
| 6,720,147 B2 | 4/2004 | Mirkin et al. | |
| 7,862,849 B2 * | 1/2011 | Stellacci et al. | 427/2.13 |
| 2001/0011575 A1 * | 8/2001 | Nakata et al. | 156/272.2 |
| 2002/0127732 A1 * | 9/2002 | Nowak et al. | 436/128 |
| 2002/0155462 A1 * | 10/2002 | Mirkin et al. | 435/6 |
| 2003/0022169 A1 * | 1/2003 | Mirkin et al. | 435/6 |
| 2003/0059537 A1 | 3/2003 | Chilokoti et al. | |
| 2003/0108913 A1 * | 6/2003 | Schouten | 435/6 |
| 2004/0106140 A1 * | 6/2004 | Thill | 435/6 |
| 2004/0247371 A1 * | 12/2004 | Maruyama et al. | 401/92 |
| 2005/0176889 A1 * | 8/2005 | Kodama et al. | 525/176 |
| 2006/0141245 A1 | 6/2006 | Stellaci et al. | |
| 2008/0253929 A1 * | 10/2008 | Park et al. | 422/68.1 |

OTHER PUBLICATIONS

Akbulut et al., Application of Supramolecular Nanostamping to the Replication of DNA Nanoarrays. Nano Letters, 7, 3493( 2007).*
Yu et al., Supramolecular nano-stamping: using DNA as movable type. Nano Letters, 5, 1061 (2005).*
Supplementary Partial European Search Report for European Patent Application No. EP 07 83 7219 dated Jun. 21, 2012.
Yu et al., High Resolution Printing of DNA Feature on Poly(methylmethacrylate) Substrates Using Supramolecular Nano-Stamping, Journal of American Chemical Society, vol. 127, No. 48, Dec. 1, 2005, pp. 16774-16775.

* cited by examiner

*Primary Examiner* — Ethan C Whisenant
(74) *Attorney, Agent, or Firm* — Mark S. Cohen; Pearl Cohen Zedek Latzer, LLP

(57) ABSTRACT

The present invention is directed to methods and materials for producing complements and reproductions of a master, including such preparation in a high throughput setting, using, inter-alia, liquid supramolecular nanostamping (LiSuNS).

57 Claims, 4 Drawing Sheets

LIQUID SUPRAMOLECULAR NANOSTAMPING (LISUNS)

CROSS-REFERENCE TO RELATED APPLICATIONS

This application is a National Phase Application of PCT International Application No. PCT/US07/18592, International Filing Date 23 Aug. 2007, claiming priority of USP Patent Application, 60/840,434, filed 28 Aug. 2006.

BACKGROUND OF THE INVENTION

There are a multitude of applications for materials and devices on a nanoscale, however to date limitations exist in tool fabrication, both in terms of accurate, reproducible yields and cost-effective generation.

Nano-imprinting methods have been developed for fabrication of such tools, using a hard mold stamped on a soft polymer film overcoating a silicon wafer, however, such technology is applicable for inorganic substrates and necessitates use of a "hard" mold and custom development to print a particular shape on a silicon wafer.

Nanotechnology has essentially been dominated by the development and characterization of materials and devices based on inorganic semiconductors and metals, at least in part due to e-beam lithographic patterning of inorganic materials on inorganic substrates. Using organic and inorganic based nano-lithography techniques, however, many different nano-devices (e.g nano-transistors, nano-sensors and nano-waveguides) are presently being fabricated. Nano-lithography, however, is extremely slow, and device fabrication time (and reproducibility) is a significant limiting factor in nanotechnology.

A major drawback of existing nanolithography techniques for fabricating nanoscale devices is that features of the device must be fabricated in a series of steps. Such techniques are accordingly limited to the construction of relatively simple devices since the fabrication of devices having greater features is too time-consuming. While multi-tip arrays for SPMs have been fabricated, to facilitate the parallel fabrication of perhaps tens or hundreds of nano-devices, it would be desirable to develop a nanoscale stamping technique that could complement such parallel device production, for mass-production of such devices, ideally developing a method that can produce many features in a parallel manner on a device in a single processing step.

Supramolecular Nanostamping (SuNS) is a printing technique for the patterning of soft organic/biomolecules. To date, the printing coverage achievable by existing techniques depends upon the roughness of the substrates utilized in the process. The extension of such a process holds promise for greater flexibility in nanocontact printing applications.

SUMMARY OF THE INVENTION

In one embodiment, this invention provides a method of forming a complement of a master, said method comprising the steps of:

a) contacting a master comprising a first set of molecules hound to a first substrate with a second set of molecules, wherein each molecule in said second set of molecules comprises:
  i) a spacer fragment;
  ii) a recognition component that is attracted to or binds to one or more of the first set of molecules, or a fragment thereof, wherein said recognition component is attached to said spacer fragment;

b) contacting said spacer fragment of said second set of molecules with a prepolymer;

c) polymerizing said prepolymer in (b) to form a second substrate; and d) breaking the attractive force or bonds formed between said first set of molecules and said second set of molecules; thereby forming a complement of the master.

In one embodiment, the spacer fragment comprises a terminally located reactive functional group, which contacts the prepolymer. In another embodiment, the first set of molecules, the second set of molecules or a combination thereof comprise nucleic acids. In one embodiment, the first set of molecules and said second set of molecules comprise nucleic acids. In one embodiment, the recognition component comprises a nucleic acid with a sequence complementary to that of said first set of molecules, or a fragment thereof, and in another embodiment, the spacer fragment comprises a string of nucleotides having no complementary sequence in said first set of molecules. In another embodiment, the spacer fragment ranges in size from about 1-100 nucleotides in length.

In one embodiment, the prepolmer comprises at least one thermopolymerizable polymer, at least one photopolymerizable polymer, or a combination thereof. In one embodiment, the prepolymer comprises an acrylate, diacrylate, oligoacrylate, methacrylate, dimethacrylate, oligomethacrylate, cinnamate, dicinnamate, oligocinnamate, or a combination thereof. In another embodiment, the method comprises the addition of a photoinitiator or organic initiator in step (c). In another embodiment, the prepolymer comprises poly (dimethylsiloxane) or a polyurethane based UV curable polymer. In another embodiment, the reactive functional group comprises a terminally located amine, acrydite, aldehyde or thiol group. In one embodiment, breaking said attractive force or bonds formed between said first set of molecules and said second set of molecules is accomplished at a specific temperature, and in another embodiment, the prepolymer polymerizes at a temperature that is less than said specific temperature.

In one embodiment, this invention provides a kit for the formation of a complement of a master comprising:

a) a master comprising a first set of molecules bound to a first substrate b) a second set of molecules, wherein each molecule in said second set of molecules comprises:
  i) a spacer fragment;
  ii) a recognition component that is attracted to or binds to one or more of the first set of molecules, or a fragment thereof, wherein said recognition component is attached to said spacer fragment;
c) a prepolymer; and
d) optionally, agents for initiating or enhancing polymerization of said prepolymer whereby attachment of said second set of molecules to said prepolymer, polymerization of said prepolymer to form a second substrate and breaking of attractive force or bonds formed between said first set of molecules or a fragment thereof and said second set of molecules forms a complement of the master.

In another embodiment, this invention provides a method of forming a reproduction of a master, or portion thereof, comprising the steps of:

a) contacting a master comprising a first set of molecules bound to a first substrate with a second set of molecules, wherein each molecule in said second set of molecules comprises:
  i) a spacer fragment;

ii) a recognition component that is attracted to or binds to one or more of the first set of molecules, or a fragment thereof, wherein said recognition component is attached to said spacer fragment;

b) contacting said spacer fragment of said second set of molecules with a prepolymer;

c) polymerizing said prepolymer in (b) to form a second substrate;

d) breaking the attractive force or bonds formed between said first set of molecules or a fragment thereof and said second set of molecules e) assembling via bond formation a third set of molecules on said second set of molecules of the complement image, wherein each molecule in the third set of molecules comprises:

i) a spacer fragment;
ii) a recognition component that is attracted to or binds to one or more of the second set of molecules, or a fragment thereof, wherein said recognition component is attached to said spacer fragment;

f) contacting said spacer fragment of said third set of molecules with a prepolymer;

g) polymerizing said prepolymer in (d) to form a third substrate; and h) breaking the attractive force or bonds formed between said second set of molecules or a fragment thereof and said third set of molecules;

whereby attachment of said second set of molecules to said prepolymer, polymerization of said prepolymer to form a second substrate and breaking of attractive force or bonds formed between said first set of molecules or a fragment thereof and said second set of molecules forms a complement of the master and attachment of said third set of molecules to said prepolymer, polymerization of said prepolymer to form a third substrate and breaking of attractive force or bonds formed between said second set of molecules or a fragment thereof and said third set of molecules forms a reproduction of the master.

In another embodiment, this invention provides a kit for the reproduction of a master comprising:

a) a master comprising a first set of molecules bound to a first substrate b) a second set of molecules, wherein each molecule in said second set of molecules comprises:

i) a spacer fragment;
ii) a recognition component that is attracted to or binds to one or more of the first set of molecules, or a fragment thereof, wherein said recognition component is attached to said spacer fragment;

c) a third set of molecules, wherein each molecule in the third set of molecules comprises:

i) a spacer fragment;
ii) a recognition component that is attracted to or binds to one or more of the first set of molecules, or a fragment thereof, wherein said recognition component is attached to said spacer fragment;

d) at least one prepolymer; and d) optionally, agents for initiating or enhancing polymerization of said prepolymer whereby attachment of said second set of molecules to said prepolymer, polymerization of said prepolymer to form a second substrate and breaking of attractive force or bonds formed between said first set of molecules or a fragment thereof and said second set of molecules forms a complement of the master and attachment of said third set of molecules to said prepolymer, polymerization of said prepolymer to form a third substrate and breaking of attractive force or bonds formed between said second set of molecules or a fragment thereof and said third set of molecules forms a reproduction of the master.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
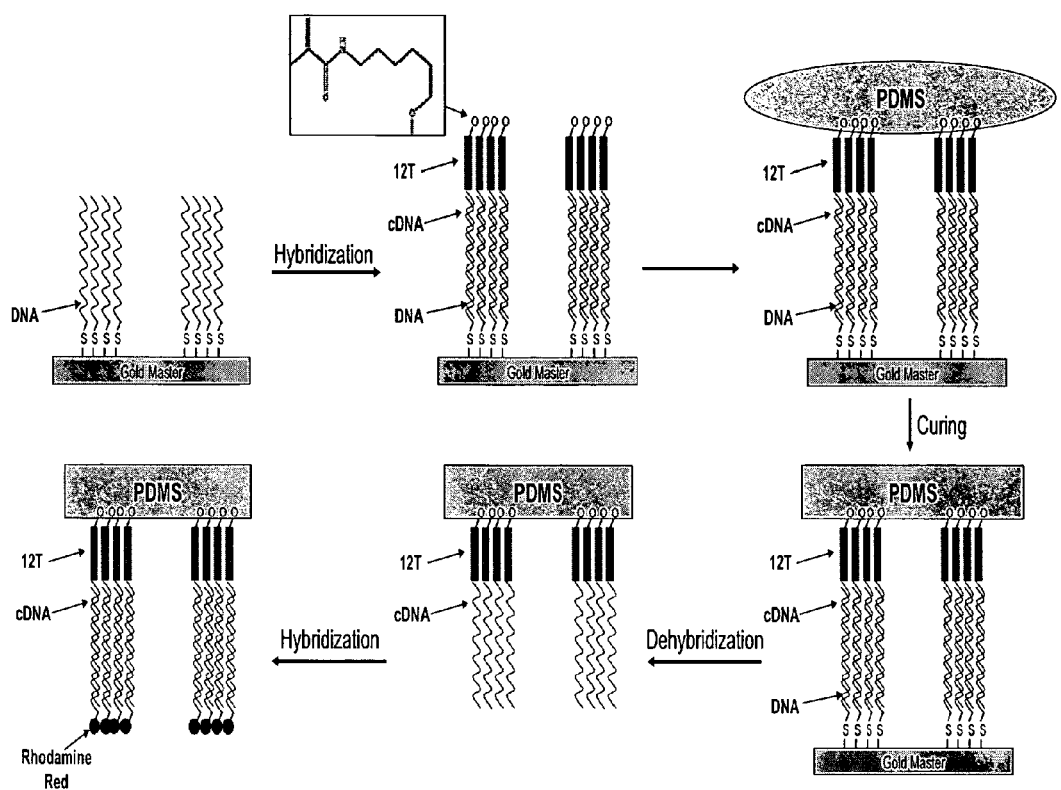
FIG. 1 schematically depicts an embodiment of a method of complement formation and reproduction of a master, in which liquid supramolecular nano-stamping (LiSuNS) is utilized.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The present invention is directed, in some embodiments, to methods and materials for producing complements and reproductions of a master on, inter-alia, a large area ($cm^2$) having microsized features.

FIG. 1 schematically depicts one embodiment of this invention, whereby a complement of a master can be prepared in a high throughput setting.

In one embodiment, this invention provides a method of forming a complement of a master, said method comprising the steps of:

a) contacting a master comprising a first set of molecules bound to a first substrate with a second set of molecules, wherein each molecule in said second set of molecules comprises:

i) a spacer fragment;
ii) a recognition component that is attracted to or binds to one or more of the first set of molecules, or a fragment thereof, wherein said recognition component is attached to said spacer fragment;

b) contacting said spacer fragment of said second set of molecules with a prepolymer;

c) polymerizing said prepolymer in (b) to form a second substrate; and d) breaking the attractive force or bonds formed between said first set of molecules and said second set of molecules;
thereby forming a complement of the master.

In one embodiment, the term "master," refers to a material having particular properties, whereby formation of a complement of such material, or a reproduction of such material is desired. In some embodiments, the material may be positioned in a particular pattern or orientation, and the complement or copy of such material may reflect the pattern or orientation. In some embodiments, the material will be positioned, or adhered to a substrate. The material will comprise, in some embodiments, a first set of molecules bound to a surface of the substrate in a random or, in another embodiment, non-random pattern.

The first set of molecules may include one or more different molecules. In some embodiments, the first set of molecules will have cognate interacting partners. For example, the first set of molecules comprises DNA, and the cognate interacting partner may be cDNA, or RNA, wherein formation of the latter may represent an embodiment of creating a complement of the master, i.e., a complement of the first set of molecules, in this embodiment. In one embodiment, complement refers to a complement of the first set of molecules, which is associated with or bonded to a second substrate, and can be separated or isolated from the first set of molecules.

In one embodiment, the term "cDNA" refers to a molecule, which, in whole or in part comprises a sequence complementary to an indicated sequence.

In one embodiment, the master comprises a pattern such that the pattern per se encodes information, for example, and in some embodiments, in that the deposition of materials on the substrate, in turn provides information in terms of the position of each of the molecules on the surface of the substrate and/or the chemical nature of the molecule.

In another embodiment, the first set of molecules is a nucleic acid, which in turn binds or specifically interacts with a particular peptide or protein, serving as its cognate partner. In another embodiment, the first set of molecules is a nucleic acid, which in turn binds or specifically interacts with a particular molecule, or a fragment thereof, wherein the fragment in turn, contain in the fragment, or in another region of the molecule, a peptide or protein, which in turn may serve as its cognate partner, or in another embodiment, such interaction is indirect. In other embodiments, the first set of molecules may comprise a ligand, and the second set of molecules comprises its cognate binding partner such as a receptor, or antibody, or vice versa. In another embodiment, the first set of molecules may comprise a particular substrate which specifically interacts with a particular enzyme. In another embodiment, the first set of molecules may comprise a protein or glycoprotein, which in turn specifically interacts with other proteins, lipids, carbohydrates or additional proteins, and whose interaction can be disrupted or competed off, for example, in order to prepare a complement as described herein.

In one embodiment, the first set of proteins comprises cellular components with which putatively, proteins or other molecules from a pathogen interact. In another embodiment, the first set of proteins comprise cell signaling proteins participating, for example, in signal transduction cascades, whose cognate binding partner is unknown. In some embodiments, such methods of preparing complements may in turn be used as methods of screening for cognate binding partners.

In other embodiments, the first and second set of molecules comprises a part or parts of cognate binding pairs, or molecules which specifically interact. In some embodiments, the first and/or second set of molecules comprise a member of any specific or non-specific binding pair, such as either member of the following non-limiting list: antibody/antigen, antibody/hapten, enzyme/substrate, enzyme/inhibitor, enzyme/cofactor, binding protein/substrate, carrier protein/substrate, lectin/carbohydrate, receptor/hormone, receptor/effector, complementary strands of nucleic acid, repressor/inducer, or the like.

In some embodiments, such molecules will comprise an exposed functionality facilitating the association or binding of the pair. Examples of exposed functionalities include —OH, —CONH—, —CONHCO—, —NH2, —NH—, —COOH, —COOR, —CSNH—, —NO2-, —SO2, —SH, —RCOR—, —RCSR—, —RSR, —ROR—, —PO4-3, —OSO3-2, —SO3-, —COO—, —SOO—, —RSOR—, —CONR2, —(OCH2CH2)nOH (where n=1-20, preferably 1-8), —CH3, —PO3H—, -2-imidazole, —N(CH3)2, —N(R)2, —PO3H2, —CN, —(CF2)nCF3 (where n=1-20, preferably 1-8), and an olefin. R is hydrogen, a hydrocarbon, a halogenated hydrocarbon, a protein, an enzyme, a carbohydrate, a lectin, a hormone, a receptor, an antigen, an antibody, or a hapten.

In some embodiments, the first and second set of molecules form a covalent linkage or a non-covalent association. In some embodiments, such specific interactions may comprise the presence of any specific attractive force, such as, for example, the attraction of a molecule having a net positive charge to a molecule having a net negative charge, dipole-dipole attraction, and magnetic attraction, covalent and non-covalent associations, such as hydrogen bonds, ionic bonds, covalent bonds, and van der Waals bonds.

In some embodiments, such interaction is specific. In some embodiments, the term "specific binding" or "specific interaction" refers to the presence of a given recognition component on one or each molecule, which binds or specifically interacts with one or more other molecules or complexes, with specificity sufficient to differentiate between the molecule or complex and other components or contaminants of a sample. In some embodiments, the molecules that include recognition components and their targets are conventional, or in other embodiments are screened for such activity via the methods and/or kits of this invention. Techniques for preparing and utilizing such systems are well known in the art, for example, as described in Tijssen, P., "Laboratory Techniques in Biochemistry and Molecular Biology Practice and Theories of Enzyme Immunoassays" (1988), eds. Burdon and Knippenberg, N. Y.: Elsevier, the entire teachings of which are incorporated herein. In some embodiments, the recognition components and their targets include nucleic acid/complementary nucleic acid, antigen/antibody, antigen/antibody fragment, avidin/biotin, streptavidin/biotin, protein A/Ig, lectin/carbohydrate, aptamer/target, and others, well known in the art.

In some embodiments, one or both sets of molecules will comprise nucleic acid. In some embodiments, the terms "nucleic acids," or "oligonucleotides," refers to a polymer of nucleotides, which comprise DNA or RNA in any of their known forms. In some embodiments, the nucleic acids may include natural nucleosides (i.e., adenosine, thymidine, guanosine, cytidine, uridine, deoxyadenosine, deoxythymidine, deoxyguanosine, and deoxycytidine) or modified nucleosides. Examples of modified nucleotides include base modified nucleoside (e.g., aracytidine, inosine, isoguanosine, nebularine, pseudouridine, 2,6-diaminopurine, 2-aminopurine, 2-thiothymidine, 3-deaza-5-azacytidine, 2'-deoxyuridine, 3-nitorpyrrole, 4-methyl indole, 4-thiouridine, 4-thiothymidine, 2-aminoadenosine, 2-thiothymidine, 2-thiouridine, 5-bromocytidine, 5-iodouridine, inosine, 6-azauridine, 6-chloropurine, 7-deazaadenosine, 7-deazaguanosine, 8-azaadenosine, 8-azidoadenosine, benzimidazole, M1-methyladenosine, pyrrolo-pyrimidine, 2-amino-6-chloropurine, 3-methyl adenosine, 5-propynylcytidine, 5-propynyluridine, 5-bromouridine, 5-fluorouridine, 5-methylcytidine, 7-deazaadenosine, 7-deazaguanosine, 8-oxoadenosine, 8-oxoguanosine, O(6)-methylguanine, and 2-thiocytidine), chemically or biologically modified bases (e.g., methylated bases), modified sugars (e.g., 2'-fluororibose, 2'-aminoribose, 2'-azidoribose, 2'-O-methylribose, L-enantiomeric nucleosides arabinose, and hexose), modified phosphate groups (e.g., phosphorothioates and 5'-N-phosphoramidite linkages), and combinations thereof. Natural and modified nucleotide monomers for the chemical synthesis of nucleic acids are commercially available.

In some embodiments, one or both sets of molecules will comprise PNA. In some embodiments, the term "peptide nucleic acid (PNA)," refers to a polymer that has a peptide backbone in which a natural or non-natural nucleic acid base is attached to each amino acid residue. Peptide nucleic acids are described in Hanvey, et al., Science (1992), 258:1481-1485, the entire teachings of which are incorporated by reference. A PNA can bind specifically to a nucleic acid or another PNA that has a complementary sequence of at least three consecutive bases to the sequence of the PNA.

The term "recognition component." as used herein, is a component of a molecule that can bind specifically to another molecule.

As used herein, "aptamer" refers to a non-naturally occurring nucleic acid that binds selectively to a target. The nucleic acid that forms the aptamer may be composed of naturally occurring nucleosides, modified nucleosides, naturally occurring nucleosides with hydrocarbon linkers (e.g., an alkylene) or a polyether linker (e.g., a PEG linker) inserted between one or more nucleosides, modified nucleosides with hydrocarbon or PEG linkers inserted between one or more nucleosides, or a combination of thereof. In one embodiment, nucleotides or modified nucleotides of the nucleic acid ligand can be replaced with a hydrocarbon linker or a polyether linker provided that the binding affinity and selectivity of the nucleic acid ligand is not substantially reduced by the substitution (e.g., the dissociation constant of the aptamer for the target should not be greater than about 16-10 M). The target molecule of a aptamer is a three dimensional chemical structure that binds to the aptamer. However, the aptamer is not simply a linear complementary sequence of a nucleic acid target but may include regions that bind via complementary Watson-Crick base pairing interrupted by other structures such as hairpin loops). Targets of aptamers include peptide, polypeptide, carbohydrate and nucleic acid molecules.

In some embodiments, the term "complement of a master," refers to the production or orientation of a second set of molecules, which comprise cognate binding, or interacting pairs with the first set of molecules, and in some embodiments, the arrangement of the second set of molecules on the second substrate is so positioned as to comprise a mirror image of the master as it is positioned on the first substrate. In some embodiments, the term "complement" refers to the physical or chemical information imparted by the second set of molecules as a function of their specific interaction or cognate binding to the first set of molecules, irrespective of their deposition or orientation on the second substrate. In one embodiment, such deposition or orientation on the second substrate represents part of the information imparted by the complement and represents an embodiment of this invention.

In some embodiments, the complement comprises a set of molecules complementary to at least a fragment or portion of the first set of molecules. For example, and in one embodiment, the first set of molecules is DNA, and the complement comprises cDNA which is complementary in sequence to at least a fragment or portion of the DNA molecules comprising the first set of molecules. It will be appreciated by one skilled in the art that any complement of this invention may comprise a second set of molecules which specifically interacts or binds to a cognate molecule, which in turn, may comprise only a portion or fragment of each of the first set of molecules, or some of the first set of molecules, which comprise the master.

In some embodiments, the chemical information transferred to the complement is not identical to the information contained within the master but is enough information to allow at least a portion of the information from the master to be reproduced.

For example, and in some embodiments, the first set of molecules comprises complex enzymes which perform more than a single task, and the second set of molecules comprises a substrate for only one of such activities. In some embodiments, the second set of molecules may only interact with a portion of the enzyme comprising the active site for the particular activity in question.

In some embodiments, the complements formed via the methods and/or kits of this invention are selected such that they comprise a second set of molecules that only bind to a portion of the molecules of the first set of molecules bound to the master.

In some embodiments, the complement, or second set of molecules binds only to a portion of the first set of molecule, and the height profile of the complement may have two or more levels.

The master may be prepared by any method known to those skilled in the art (see Xia, et al., Chem. Rev. (1999), 99:1823-1848, the entire teachings of which are incorporated by reference). In some embodiments, the method of forming the master is a nanopatterning method. In one embodiment, the master is prepared by forming a pattern of one or more metal, metal oxide, or combinations thereof on a surface of a substrate using electron beam lithography. According to this aspect, the surface of the substrate is then contacted with a first set of molecules. In this embodiment, each of the first set of molecules has a reactive functional group that forms a bond between the metal or metal oxide and the molecules of the first set of molecules, so that the first set of molecules binds to the substrate forming a master having a first set of molecules bound to the substrate to form a pattern. For example, when the reactive functional group of at least one molecule from the first set of molecules is a thiol group or a protected thiol group, at least a portion of the patterned formed may be a metal selected from the group consisting of gold, silver, copper, cadmium, zinc, palladium, platinum, mercury, lead, iron, chromium, manganese, tungsten, and any alloys thereof.

In another example, when the reactive functional group of at least one molecule from the first set of molecules is a carboxylic acid, at least a portion of the patterned formed is an oxide selected from the group consisting of silica, alumina, quartz, and glass.

In another example, when the reactive functional group of at least one molecule from the first set of molecules is a nitrile or an isonitrile, at least a portion of the patterned formed is a metal selected from the group consisting of platinum, palladium and alloys thereof.

In another example, when the reactive functional group of at least one molecule from the first set of molecules is a hydroxamic acid, at least a portion of the patterned formed is copper.

In another embodiment, the master can be prepared using dip pen nanolithography. Methods of preparing molecularly patterned substrates using dip pen nanolithography are described in Ginger D S, Zhang H, Mirkin C A Angewandte Chemie International Edition 43 (1): 30-45 2004 and in Piner, et al., Science (1999), 283:661-663, the entire teachings of both references are incorporated herein by reference.

In another embodiment, the master can be prepared using replacement lithography, nanoshading or nanografting. These methods are described in Sun, et al., JACS (2002), 124(11):2414-2415; Amro, et al., Langmuir (2000), 16:3006-3009; Liu, et al., Nano Letters (2002), 2(8):863-867; and Liu, et al., Acc. Chem. Res. (2000), 33:457-466; the entire teachings of these references are incorporated herein by reference.

Some embodiments for the preparation of the master are exemplified herein, as well, for example, via the use of the TIPS® system, or in some embodiments, any ink jet printers, for example, portable ink jet printers, commercially available and readily known by one skilled in the art, and variations thereof, which are to be considered as part of this invention. It is to be understood that any method known to one skilled in the art for depositing a series of molecules on a substrate may be used in accordance with this invention and is to be considered an embodiment thereof.

The methods and/or kits of this invention make use of a master comprising a first set of molecules bound to a first substrate being contacted with a second set of molecules.

In one embodiment, the term "contacted" refers to any means of bringing the indicated materials in proximity with each other, via direct or indirect means. Contact may in turn refer to direct deposition of one material onto another, indirect conveyance, for example via fluidic devices, when a solution or suspension of a molecule is being contacted with a solid substrate, for example.

In one embodiment, the second set of molecules is assembled on the first set of molecules by contacting the master with a solution comprising the second set of molecules. In one embodiment, a solution comprising the second set of molecules is applied to the master, and a substrate, for example, a glass plate, is held in contact with the master, such that the solution comprising the second set of molecules is distributed over the master by capillary action. In some embodiments, this substrate, e.g. glass plate, is not in any way adherent to the second set of molecules, and in fact may be treated to diminish adherence of the second set of molecules. In some embodiments, a slight vacuum or source of mechanical force is applied to facilitate even distribution of the solution over the master. In some embodiments, the solution comprising the second set of molecules is then slowly evaporated causing the master and the second substrate to come closer together and facilitating binding of the second set of molecules to the first set of molecules. According to this aspect of the invention, contact between the first and second set of molecules preserves the desired orientation of the second set of molecules such that the spacer fragment of the second set of molecules is positioned distally to the master substrate, and relatively free of association with the first set of molecules.

In some embodiments, the substrates for use in the methods and/or kits of this invention may comprise a wide variety of materials including, but not limited to, silicon, silicon dioxide, silicon nitride, glass and fused silica, gallium arsenide, indium phosphide, III-V materials, PDMS, silicone rubber, aluminum, ceramics, polyimide, quartz, plastics, resins and polymers including polymethylmethacrylate, acrylics, polyethylene, polyethylene terepthalate, polycarbonate, polystyrene and other styrene copolymers, polypropylene, polytetrafluoroethylene, superalloys, zircaloy, steel, gold, silver, copper, tungsten, molybdeumn, tantalum, KOVAR, KEVLAR, KAPTON, MYLAR, teflon, brass, sapphire, etc. High quality glasses such as high melting borosilicate or fused silicas may be used, in some embodiments, for their UV transmission properties when any of the subsequent manipulation and/or detection steps require light based technologies.

In one embodiment, at least some of the molecules of the first set of molecules, or the second set of molecules, or a combination thereof, include a recognition component that facilitates binding or association between the two sets of molecules. For example, each of the molecules of the first set of molecules may include a recognition component that is a nucleic acid sequence. In one embodiment, each of the first set of molecules is a nucleic acid sequence and the recognition component of the second set of molecules is a nucleic acid sequence. In one embodiment, the nucleic acid recognition component of each of the second set of molecules is complementary to at least a portion of a nucleic acid sequence of at least one of the molecules from the first set of molecules. For example, three or more consecutive nucleic acid bases, or, in some embodiments, six or more nucleic acid bases, of a molecule from the second set of molecules is complementary with three or more consecutive nucleic acid bases, or in other embodiments, six or more nucleic acid bases, of a molecule from the first set of molecules. When the second set of molecules is assembled on the first set of molecules, the second set of molecules will hybridize with molecules from the first set of molecules that have a complementary sequence, or a portion thereof, to the nucleic acid recognition component of the second set of molecules. In this embodiment, typically, the first set of molecules bound to the master are contacted with a solution of the second set of molecules under conditions that promote hybridization. Conditions that promote hybridization are known to those skilled in the art. A general description of hybridization conditions are discussed in Ausebel, F. M., et al., Current Protocols in Molecular Biology, Greene Publishing Assoc. and Wiley-Interscience, 1989, the teachings of which are incorporated herein by reference. Factors such as sequence length, base composition, percent mismatch between the hybridizing sequences, temperature and ionic strength influence the stability of nucleic acid hybrids.

In one embodiment, distal to the recognition component of the second set of molecules is a spacer fragment, which is oriented away from the master, upon association of the second set of molecules with the first set of molecules on the master.

In one another embodiment, the term "spacer fragment" refers to a material which is bound to or associated with the recognition component of the second set of molecules. The spacer fragment, in some embodiments, is non-reactive, or in other embodiments, does not associate or bind to the first set of molecules. In some embodiments, the spacer fragment is any inert chemical entity, which can be positioned between the second set of molecules and the prepolymer. In some embodiments, the spacer fragment is a large reactive functional group, which reacts exclusively with the prepolymer, and does not interact, or minimally interacts with the first set of molecules. In some embodiments, the spacer fragment may additionally comprise a reactive functional group, located terminally, which group associates with or binds the prepolymer. In some embodiments, the spacer fragment itself, or a terminal portion thereof, is part of the prepolymer and upon polymerization becomes a part of the polymer, which comprises the second substrate, or in other embodiments, the indicated substrate, for example as described in methods of reproduction of a master as described hereinbelow.

In one embodiment, for example, when the first set of molecules, or second set of molecules, or combination thereof comprise nucleic acid, the spacer fragment comprises a string of nucleotides having no complementary sequence in said first set of molecules. According to this aspect of the invention, and in another embodiment, the spacer fragment ranges in size from about 1-100 nucleotides in length.

In one embodiment, the spacer fragment comprises a terminally located reactive functional group, distal to the recognition component of the molecule, which contacts a prepolymer, or in another embodiment, the spacer fragment comprises, or essentially comprises, or more than 75% of the molecule, or more than 60% of the molecule, or more than 50% of the molecule comprises a large reactive functional group which can interact with the prepolymer.

The reactive functional group on the second set of molecules is typically a group that can bind to the surface of the second substrate, or in other embodiments, the third set of molecules on a third substrate, and in other embodiments, additional substrates and molecules, as needed in repeat cycles of the methods as herein described.

In some embodiments, for example, when the first set of molecules, or second set of molecules, or combination thereof comprise nucleic acid, the reactive functional group may comprise an amino, thiol, and Acrydite™ group, which facilitates adherence of the oligonucleotide to the prepolymer. In another embodiment, such reactive groups may also serve to adhere the first set of molecules to the first substrate, forming the master, or in other embodiments, any set of molecules to its corresponding substrate, as appropriate for the methods and/or kits of this invention.

In one embodiment, the term "prepolymer" refers to any material which when first applied or contacted with an element as herein described, requires additional time, manipulation, exposure to particular conditions, etc., in order to be in its final form. In some embodiments, the prepolymer is a liquid or gel, or solgel form, which solidifies as a function of a particular set of conditions. In some embodiments, such conditions involve environmental conditions such as light exposure, temperature, oxygen, and others as will be appreciated by one skilled in the art.

The methods and/or kits of this invention allow for the "polymerization" of the prepolymer, which in turn becomes the second, third, fourth, etc., substrate bound or associated with the corresponding set of molecules, as herein described. In one embodiment, the terms "polymerize", "polymerizing", or other forms of this phrase comprise any condition whereby the material which forms the corresponding substrate is converted or allowed to exist in its final form. In some embodiments the terms refer to the solidification, such as complete or partial solidification, or gellation, of the prior material to form a more solidified or gelled corresponding substrate.

In one embodiment, the prepolmer comprises a photopolymerizable polymer, which following exposure to any light source, solidifies or gels, etc., as herein described.

In one embodiment, the prepolymer comprises an acrylate, diacrylate, oligoacrylate, methacrylate, dimethacrylate, oligomethacrylate, cinnamate, dicinnamate, oligocinnamate, or a combination thereof. In another embodiment, the method comprises the addition of a photoinitiator or organic initiator in step (c). In another embodiment, the prepolymer comprises poly (dimethylsiloxane) or a polyurethane based UV curable polymer.

In one embodiment, the polymer is a homopolymer, or in other embodiments, a heteropolymer. In one embodiment, the polymer comprises poly(ethylene glycol) dimethacrylate (PEGDM). In another embodiment the polymer comprises polyacrylates such as poly(methyl methacrylate), poly(ethyl methacrylate), poly(butyl methacrylate), poly(isobutyl methacrylate), poly(hexyl methacrylate), poly(isodecyl methacrylate), poly(lauryl methacrylate), poly(phenyl methacrylate), poly(methyl acrylate), poly(isopropyl acrylate), poly(isobutyl acrylate) and poly(octadecyl acrylate), or any combination thereof. In another embodiment, the polymer comprises any rubber or elastomer known in the art, including, for example, polybutadiene, poly(ethylene-propylene), polychoroprene, polyisoprene, nitrile (a copolymer of acrylonitrile and butadiene), butyl (a copolymer of isobutylene and isoprene), other polysiloxanes and polyurethanes, or any combination thereof. In another embodiment, the polymer comprises a vinyl polymer such as polyethylene, polypropylene, poly (vinyl choloride), polytetrafluoroethylene, polystyrene, poly (acrylic acid) etc., or others known in the art, see for example, Polymer chemistry, an introduction, $3^{rd}$ edition, Malcolm P. Stevens., Oxford. In another embodiment, the polymer may comprise any listed herein or combinations thereof.

In one embodiment, a pre-cured (partially cured) polymer, as described herein, may serve as a second, third, fourth, etc. (or any subsequent) substrate for the methods, devices, apparatuses, etc., of this invention. According to this aspect of the invention, and in one embodiment, following application of the precured polymer onto a hybridized master, the polymer is fully cured.

In some embodiments, the polymer comprises photopolymerizable monomers, which may have a residue which when exposed to an appropriate source, may polymerize with another monomer, or polymer. In one embodiment, the photopolymerizable monomer may comprise a methacrylic, acrylin, vinylic, cinnamic residue, or multiples thereof.

In some embodiments, the prepolymer polymerizes under conditions, for example, at a temperature in which the association between the first set of molecules and second set of molecules is essentially maintained. For example, and in one embodiment, when the first and second set of molecules comprise nucleic acid, a prepolymer is contacted with the master and second set of molecules according to the methods of this invention, at a temperature at which the first and second set of molecules are still essentially associated with each other, yet the temperature is sufficient to cure, harden or otherwise polymerize the polymer.

In some embodiments, the polymer refers to any solid, such as, for example, a glass, which can be made to solidify under particular conditions which does not disrupt the interaction between the first and second set of molecules, and in some embodiments, at least minimally maintains the orientation such that the spacer fragment of the second set of molecules is the region of the second, or third, or fourth, etc. set of molecules is the region of association of these molecules with the material which forms the corresponding substrate.

It is to be understood that the methods and/or kits of this invention comprise any means, and/or any material by which a non-solid, or not entirely solid substrate can be affixed, adhered or associated with a series of molecules oriented such that distal to the association site with the substrate is a region which comprises a recognition component that can in turn interact with another set of molecules and participate in the formation of a complement or reproduction of a master, as herein described.

The methods and/or kits of this invention provide for the polymerization or conversion of the prepolymer to form a corresponding substrate and subsequent breaking of the attractive force or bonds formed between the attached set of molecules and cognate set of molecules, e.g., the first set of molecules and second set of molecules, thereby forming a complement, or reproduction of the master, respectively and as described herein.

In one embodiment, breaking the attractive forces or bonds formed between said first set of molecules and said second set of molecules, or the second and third set of molecules, and so forth, is accomplished via any means, whereby the desired properties of the respective molecules are maintained, such that complement formation or reproduction may be subsequently accomplished.

In one embodiment, such breaking of the attractive forces or bonds may be accomplished via the application of heat, current, vibration, sonication, competition, pressure, or other means, as will be appreciated by one skilled in the art.

In one embodiment, breaking the attractive forces or bonds formed between said first set of molecules and said second set of molecules, or the second and third set of molecules, and so forth, is accomplished at a specific temperature, and in another embodiment, the prepolymer polymerizes at a temperature that is less than the specific temperature.

In one embodiment of the invention, breaking the attractive forces or bonds formed between said first set of molecules and said second set of molecules, or the second and third set of molecules, and so forth, is accomplished via the use of reversible supra-molecular chemistry between the indicated sets of molecules (e.g., hydrogen bonds, ionic bonds, covalent bonds, van der Waals bonds, or a combination thereof); and the use of substantially irreversible surface chemistry, between the respective sets of molecules and their corresponding substrates such that only the reversible bonds between the respective set of molecules are broken.

In one embodiment, the term "substantially irreversible," refers to the respective set of molecules being attached to the surface of the corresponding substrate by bonds that are stable to conditions that will break the bonds between the two sets of cognate molecules.

In some embodiments, the methods and/or kits of this invention make use of supra-molecular bonds as a means for shape-transfer, avoiding the necessity for mechanical contacts in complement formation or reproduction, thus constituting a major departure from currently used nano-imprinting technology. In one embodiment, the methods and/or kits of this invention find application in the transfer of organic patterns reliably. In some embodiments, the use of organic molecules allows a great number of variations and enables the transfer of multiple surface features at the same time.

In one embodiment, hydrogen bonds form the association between the respective sets of molecules and can be broken by any means known in the art. In some embodiments, when the molecules comprise nucleic acids, such hydrogen bonding may be disrupted via the use of certain enzymes. For example, and in some embodiments, an enzyme from the helicase family of enzymes may be used to break the bonds between hybridized nucleic acid molecules. Various helicases have been reported to dehybridize double stranded oligonucleotides. For example, *E. coli* Rep, *E. coli* DnaB, *E. coli* UvrD (also known as Helicase 11), *E. coli* RecBCD, *E. coli* RecQ, bacteriophage T7 DNA helicase, human RECQL series; WRN(RECQ2), BLM(RECQL3), RECQL4, RECQL5, *S. Pombe* rqhl, *C. elegance* T04A11.6 (typically, the helicase name is derived from the organism from which enzymes comes). Helicases can be divided into two types: 1) helicase that move along the nucleic acid strand in the 3' direction, and 2) helicases that more along the nucleic acid strand in the 5' direction. Typically, the particular type of helicase used to break the hydrogen bonds between the hybrided nucleic acids are selected by considering structural hindrance of the particular hybridized nucleic acids. Cofactors which stabilize single stranded DNA, such as single stranded DNA binding protein (SSB), may be added.

Another method of breaking the bonds between two hybridized nucleic acids may comprise use of a restriction endonuclease, which recognizes specific base sequence and cleaves both strands at a specific location in the nucleic acid sequence. Examples of restriction endonucleases include BamHI, EcoRI, and BstXI. Other methods of dehybridazition of nucleic acids using enzymes can be found in Lubert Stryer, Biochemistry, 4th Edition; Benjamin Lewin, Gene VII; Kristen Moore Picha and Smita S. Patel, "Bacteriophage T7 DNA Helicase Binds dTTP, Forms Hexamers, and Binds DNA in the Absence of Mg2+," J. Biol. Chem. (1998), Vol. 273, Issue 42, 27315-27319; Sheng Cui, Raffaella Klima, Alex Ochem, Daniele Arosio, Arturo Falaschi, and Alessandro Vindigni, "Characterization of the DNA-unwinding Activity of Human RECQ1, a Helicase Specifically Stimulated by Human Replication Protein A." J. Biol. Chem. (2003), Vol. 278, Issue 3, 1424-1432; Umezu, K., and Nakayama, H. (1993), J. Mol. Biol. 230:1145-1150; Nakayama, K., Irino, N., and Nakayama, H., Mol. Gen. Genet. (1985), 200:266-271; Kusano, K., Berres, M. E., and Engels, W. R., Genetics (1999), 15:1027-1039; Ozsoy, A. Z., Sekelsky, J. J., and Matson, S. W., Nucleic Acids Res. (2001), 29:2986-299, the entire teachings of these references is incorporated herein by reference.

In one embodiment, the bonds between the first set of molecules and the second set of molecules are broken by applying heat. In another embodiment, the bonds between the first set of molecules and the second set of molecules are broken by contacting the bonds with a solution having a high ionic strength. In another embodiment, the bonds between the first set of molecules and the second set of molecules are broken by contacting the bonds with a solution having a high ionic strength and applying heat. Alternatively, the bonds between the first set of molecules and the second set of molecules are broken by contacting them with a solution containing an enzyme that breaks the bonds.

In some embodiments, such bonds or associations may be broken by supply of a competitive binding compound, which has a greater affinity for one of the two sets of molecules. For example, and in one embodiment, when the first set of molecules comprises a receptor, and the second set of molecules comprises the native or synthetic ligand, application of a receptor agonist, or antagonist, with greater affinity for the receptor than the second set of molecules may be sufficient to displace the bound second set of molecules.

It is to be understood that any means known in the art, whereby such bonds or associations between the various sets of molecules may be disrupted or broken are to be considered as part of this invention. In some embodiments, such means will comprise preservation of most or essentially all of the desired characteristics of the respective sets of molecules, including their ability to participate in additional rounds of hybridization, or bond formation with other corresponding sets of molecules. In another embodiment, such means will comprise preservation of most, or essential binding or association with the corresponding substrate.

In one embodiment, this invention provides a kit for the formation of a complement of a master comprising:

a) a master comprising a first set of molecules bound to a first substrate b) a second set of molecules, wherein each molecule in said second set of molecules comprises:
  i)) a spacer fragment;
  ii) a recognition component that is attracted to or binds to one or more of the first set of molecules, or a fragment thereof, wherein said recognition component is attached to said spacer fragment;

c) a prepolymer; and d) optionally, agents for initiating of enhancing polymerization of said prepolymer whereby attachment of said second set of molecules to said prepolymer, polymerization of said prepolymer to form a second substrate and breaking of attractive force or bonds formed between said first set of molecules or a fragment thereof and said second set of molecules forms a complement of the master.

In another embodiment, this invention provides a method of forming a reproduction of a master, or portion thereof, comprising the steps of:

a) contacting a master comprising a first set of molecules bound to a first substrate with a second set of molecules, wherein each molecule in said second set of molecules comprises:
  i) a spacer fragment;
  ii) a recognition component that is attracted to or binds to one or more of the first set of molecules, or a fragment thereof, wherein said recognition component is attached to said spacer, fragment;

b) contacting said spacer fragment of said second set of molecules with a prepolymer;

c) polymerizing said prepolymer in (b) to form a second substrate;

d) breaking the attractive force or bonds formed between said first set of molecules or a fragment thereof and said second set of molecules e) assembling via bond formation a third set of molecules on said second set of molecules of the complement image, wherein each molecule in the third set of molecules comprises:
  i) a spacer fragment;
  ii) a recognition component that is attracted to or binds to one or more of the second set of molecules, or a fragment thereof, wherein said recognition component is attached to said spacer fragment;

f) contacting said spacer fragment of said third set of molecules with a prepolymer;

g) polymerizing said prepolymer in (d) to form a third substrate; and h) breaking the attractive force or bonds formed between said second set of molecules or a fragment thereof and said third set of molecules;

whereby attachment of said second set of molecules to said prepolymer, polymerization of said prepolymer to form a second substrate and breaking of attractive force or bonds formed between said first set of molecules or a fragment thereof and said second set of molecules forms a complement of the master and attachment of said third set of molecules to said prepolymer, polymerization of said prepolymer to form a third substrate and breaking of attractive force or bonds formed between said second set of molecules or a fragment thereof and said third set of molecules forms a reproduction of the master.

In another embodiment, this invention provides a kit for the reproduction of a master comprising:

a) a master comprising a first set of molecules bound to a first substrate b) a second set of molecules, wherein each molecule in said second set of molecules comprises:
  i) a spacer fragment;
  ii) a recognition component that is attracted to or binds to one or more of the first set of molecules, or a fragment thereof, wherein said recognition component is attached to said spacer fragment;

c) a third set of molecules, wherein each molecule in the third set of molecules comprises:
  i) a spacer fragment;
  ii) a recognition component that is attracted to or binds to one or more of the first set of molecules, or a fragment thereof, wherein said recognition component is attached to said spacer fragment;

d) at least one prepolymer; and d) optionally, agents for initiating or enhancing polymerization of said prepolymer whereby attachment of said second set of molecules to said prepolymer, polymerization of said prepolymer to form a second substrate and breaking of attractive force or bonds formed between said first set of molecules or a fragment thereof and said second set of molecules forms a complement of the master and attachment of said third set of molecules to said prepolymer, polymerization of said prepolymer to form a third substrate and breaking of attractive force or bonds formed between said second set of molecules or a fragment thereof and said third set of molecules forms a reproduction of the master.

In some embodiments, the method of forming a reproduction of a master is essentially similar to that used to form a complement of the master, however in this aspect the complement image of the master is used as a template (or "master") to transfer the pattern to the third substrates. Thus, the embodiments and examples disclosed above for the second set of molecules and the second substrate apply as well to the third set of molecules and the third substrate, respectively, and so forth, for successive rounds of preparation of additional complements, in some embodiments, or additional reproductions of the master, in other embodiments.

The various embodiments and examples provided herein regarding the conditions for assembling the second set of molecules on the first set of molecules and for breaking the bonds between the first and the second set of molecules can apply equally as well to conditions for assembling the third set of molecules on the second set of molecules and for breaking the bonds between the third and the second set of molecules, and each subsequent set of molecules used.

It is to be understood that each method and/or kit of this invention may comprise the preparation of multiple complements or reproductions of the masters as herein described by repeating specific steps of the methods, or repeat application of the element of the kits, such that complementary sets of molecules and/or reproductions of the masters are prepared.

The methods and/or kits of this invention provide many advantages for applications in which multiple printings of complements or reproductions of a master are desired. In one embodiment, such methodology and/or kits enables the printing of multiple copies simultaneously, and thus can find application in, for example, the design of DNA microarrays, in a cost-effective manner and with substantially improved printing coverage.

In some embodiments, the methods and/or kits of this invention may be so designed and/or applied to automated settings, for example, via the assembly of an apparatus with automated conveyance of solutions, for example using robotics, or other assembly-line type machinery for high throughput applications.

For example, such an apparatus may constructed so as to comprise one or more reservoirs that contain the respective set of molecules, one or more vessels or components for holding a master in position for delivery of the solution containing the second set of molecules, or substrate comprising the complement, which is in turn used to create a complement or reproduction, respectively, of the master. In some embodiments, such an apparatus may include a computer controlled means for transferring in a predetermined manner the solution of the respective sets of molecules from the reservoirs to the surface of a master, or successively formed substrate. In some embodiments, a clamp that secures the master to a substrate used to facilitate even distribution of the solution comprising the desired set of molecules (as herein described) may also be included in the apparatus of the invention. In some embodiments, such apparatus may comprise a variety of controllers for application of heat, light, pressure, ultrasonic vibration, etc., as desired. For example, and in on embodiment, the temperature of the solution of the second set of molecules and the vessel containing the master may be controlled. The apparatus may also include, in other embodiments, a reservoir containing a solution for breaking the bonds between the first and the second molecules, such as a solution having a high ionic strength or a solution containing an enzyme that will break the bonds, and a means for delivering the solution. In addition, after, for example, the second substrate has been bound to the second set of molecules, a heating element may be used to heat a solution in contact with the bound first and second sets of molecules to break the bonds, in some embodiments of the invention. The computer controlled means for transferring solutions and controlling temperature can be implemented by a variety of general purpose laboratory robots, such as that disclosed by Harrison et al, Biotechniques, 14: 88-97 (1993); Fujita et al, Biotechniques, 9: 584-591 (1990); Wada et al, Rev. Sci. Instrum., 54: 1569-1572 (1983), the entire teachings of these references are incorporated herein by reference. Such laboratory robots are also available commercially, e.g. Applied Biosystems model 800 Catalyst (Foster City, Calif.).

In some embodiments, the apparatus may comprise any number of means for the isolation and/or separation of the master and formed substrate, or subsequently formed substrates from each other.

The methods and/or kits and/or apparatuses of this invention provide a versatile platform that enables modification of the printed materials. Such modification may be subsequent to formation of the complement or reproduction of the master, and in turn, may be automated as well, and incorporated as part of the apparatuses and methods of this invention. Materials to effect such modification may additionally comprise the kits of this invention.

For example, and in some embodiments, printed DNA can be modified with other materials both organic and inorganic (metal nanoparticles, for example) by assembling along a pattern composed of DNA strands, or the methods/kits/apparatuses may in other embodiments be used to produce other complex nano-devices currently manufactured slowly and expensively such as micro- and nano-fluidics channels, single-electron transistors, optical biosensors, and metallic wires.

These and other aspects of the present invention will be further appreciated upon consideration of the following Examples, which are intended to illustrate certain embodiments of the invention but are not to be construed as limiting in scope.

EXAMPLES

Materials and Methods

Preparation of a Master:

A gold grid pattern fabricated with optical lithography (10 µm×10 µm) was dipped in 4 µM solution of the primary DNA molecules for 5 days to generate a patterned master. The master was exposed to 1 mM 6-mercapto-1-hexanol aqueous solution for 1 hr to minimize nonspecific adsorption of single-stranded DNA, then rinsed with water 5 times and air-dried. The master was then exposed to a 2 µM solution of the secondary DNA for 2 hours so that hybridization occurred.

The HP Thermal Inkjet pico-fluidic drop dispense system (TIPS) system dispenses liquids in pico-liter sized quantities by controlling the pressure and the nozzle size. Using this TIPS system, a 70 µM solution of the primary DNA molecules were dropped on a gold-on-glass substrate. The size range of resulting DNA dots formed on the substrate was 20 µm~100 µm. After incubating the fabricated master in a humid chamber for 5 days to allow for DNA monolayer on surface, the master was exposed to 1 mM 6-mercapto-1-hexanol aqueous solution for 1 hr to minimize nonspecific adsorption of single-stranded DNA, then rinsed with water 5 times and air-dried. The master was then exposed to a 2 µM solution of the secondary DNA for 2 hours so that hybridization occurred.

Preparation of a Complement of the Master:

The master containing DNA patterns of parallel lines (50 µm thick) was fabricated on a gold substrate by injecting thiolated DNA solutions into microfluidic channels (µFN), having a sequence of: 5'-TCC CAA AGA ACA GTG GTG GCT CAA GCT ACG GCC CCT CAT GAA AAT CCT GG-3' (SEQ ID NO: 1). Acrydite-functionalized cDNA, purchased from IDT DNA technology (sequence: 5'-(TTT TTT TTT TTT) CCA GGA TTT TCA TGA GGG GCC GTA GCT TGA GCC ACC ACT GTT CTT TGG GA-3' (SEQ ID NO: 2) in 1 M NaCl/TE buffer was applied to the master for 2 hour. and hybridization of the cDNA to the master DNA was allowed to proceed. The PDMS prepolymer solution was prepared from a silicon elastomer base and curing agent (Sylgard 184) thoroughly mixed with a weight ratio of 10:1, allowed to settle for 1 hour to remove trapped air bubbles, poured into a Petri dish containing the master followed by curing at 60° C. for 2 hour.

Once the polymer cured, forming a second substrate, the cDNA and master DNA were separated, by heating the materials to 75° C., a temperature at which the nucleic acid strands melt, thus de-hybridize. The complexed second substrate-complement (cDNA) was rinsed and hybridized with DNA tagged with fluoroscence dye having the same sequence as the DNA of the master (referred to herein as "original DNA").

Using a microfluidic network, a master with 6 lines composed of two different kinds of DNA molecules (SEQ ID NO: 3 and 4, respectively) (thiol-C6-A, thiol-C6-B: A: 5'-TCC CAA AGA ACA GTG GTG GCT CAA GCT ACG GCC CCT CAT GAA AAT CCT GG-3'; B: 5'-CCC TCA GCC CTC GCC ATC ATG GAA AAT GCC AAT GTT CTG GCC CGT TAT GC-3') was fabricated on a gold substrate, as described hereinabove. A mixture solution of acrydite-functionalized cDNA molecules, purchased from IDT DNA technology in 1 M NaCl/TE buffer was applied to the master for 2 hours. A': 5'-(TTT TTT TTT TTT) CCA GGA TTT TCA TGA GGG GCC GTA GCT TGA GCC ACC ACT GTT CTT TGG GA-3'

(SEQ ID NO: 5); B': 5'-(TTT TTT TTT TTT) GCA TAA CGG GCC AGA ACA TTG GCA TTT TCC ATG ATG GCG AGG GCT GAG GG-3' (SEQ ID NO: 6). The hybridized master was rinsed and air-dried, and PDMS prepolymer solution prepared. Silicon elastomer base and curing agent (Sylgard 184) were thoroughly mixed with a weight ratio of 10:1. It was allowed to settle for 1 hour to remove trapped air bubbles. This mixture was poured into a Petri dish containing the master followed by curing at 60° C. for 2 hour.

Once the polymer cured, forming a second substrate, the cDNA and master DNA were separated, by heating the materials to 75° C., a temperature at which the nucleic acid strands melt, thus de-hybridize. The complexed second substrate-complement (cDNA) was rinsed and hybridized with thiol-C6-A modified with Rhodamine Red (A: 5'-TCC CAA AGA ACA GTG GTG GCT CAA GCT ACG GCC CCT CAT GAA AAT CCT GG-3' SEQ ID NO: 7)); and thiol-C6-B modified with Rhodamine Green (B: 5'-CCC TCA GCC CTC GCC ATC ATG GAA AAT GCC AAT GTT CTG GCC CGT TAT GC-3' (SEQ ID NO: 8)).

Fluorescently-Tagged DNA Molecules

The fluorescently-tagged DNA was purchased from IDT DNA technology.

Example 1

Liquid Supramolecular Nano-Stamping (LiSuNS) for the Formation of a Complement

In general, support-attached oligonucleotides are used to capture something, hold on to it, enrich it, and identify and/or purify it. The major class of solid support-attached oligonucleotides, DNA oligonucleotide microarrays, provide a powerful tool for analysis of gene expression. The most generally accessible approach for producing oligonucleotide microarrays is to synthesize the individual oligonucleotides separately prior to immobilization on the solid surface. In this case the oligonucleotide is modified with a functional group that allows attachment to a reactive group on a solid surface. The methods employed to date to synthesize such arrays however, are cumbersome and time consuming, and alternative methods with high reproducibility and ease of manufacture are clearly desirable.

In order to advance such methods of complement formation, a new method was devised in which liquid supramolecular nano-stamping (LiSuNS) was utilized. One embodiment of such a method is schematically depicted in FIG. 1. A master comprising a given thiolated DNA sequence attached to a gold substrate is prepared. cDNA, complementary to the original DNA sequence is allowed to hybridize to the original DNA. The cDNA is so prepared as to contain a substantially big spacer fragment as protection group, in this case 12 thymine nucleotides, comprising a terminally functionalized reactive group, in this embodiment, an acrydite functionalized base. After hybridization, a prepolymer solution is introduced on the master and cured instead of a solid secondary substrate. Since complementary DNA (cDNA) contains a functional group that is able to make a crosslinking bond with the introduced polymer, cDNA molecules are attached to the polymerized substrate after the curing step. Once the curing of the second substrate is complete, heat is applied, thus the 2 DNA strands melt, thus dehybridize, and another set of DNA molecules is introduced and allowed to hybridize with the complement prepared. These DNA molecules contain the same sequence as that of the original DNA in the master, however, a reporter is conjugated to the DNA, to enable ready detection of hybridization of the DNA to the complement.

Some advantages to this design include, inter-alia, the achievement of enhanced printing coverage (more than 2 cm×5 cm) compared to that available in current methods. Moreover the methods for formation of a complement or reproduction of a master as herein described are applicable for extremely rough surfaces, which to date, conventional printing techniques cannot provide. The proposed methods in addition do not require surface functionalization of secondary substrates and/or the presence of a blocking step for unprinted areas, which in turn provide for reduction in time and labor associated with such methods.

Example 2

Figure 2:
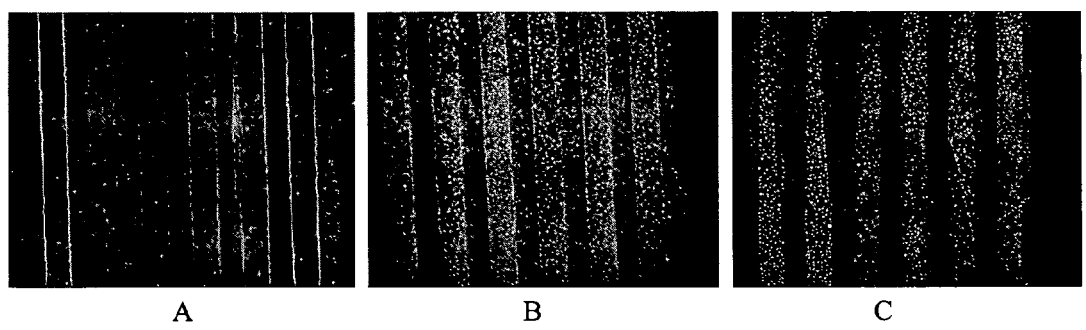
FIG. 2 demonstrates the formation of a complement of a master, and its reproduction in which thiolated DNA patterns of parallel lines of a single DNA sequence formed on the master via use of microfluidic channels.

Complement Formation and Reproduction of a Master Comprising a Single DNA Species FIG. 2 shows the results of one embodiment of this invention, wherein the formation of a complement of a master was achieved, in which thiolated DNA patterns of parallel lines of a single DNA sequence were formed on a gold substrate and hybridized with acrydite functionalized cDNA, attached to PDMS as described. The printed patterns were formed by hybridization with original sequenced DNA tagged with fluorescent dye to the complement, creating a reproduction of the master, in this embodiment. FIG. 2A shows visualization of the master, while 2B and 2C show individual sites of hybridization of the reproduced DNA when hybridized to the complement, in repeated printing runs, respectively.

Example 3

Figure 3:
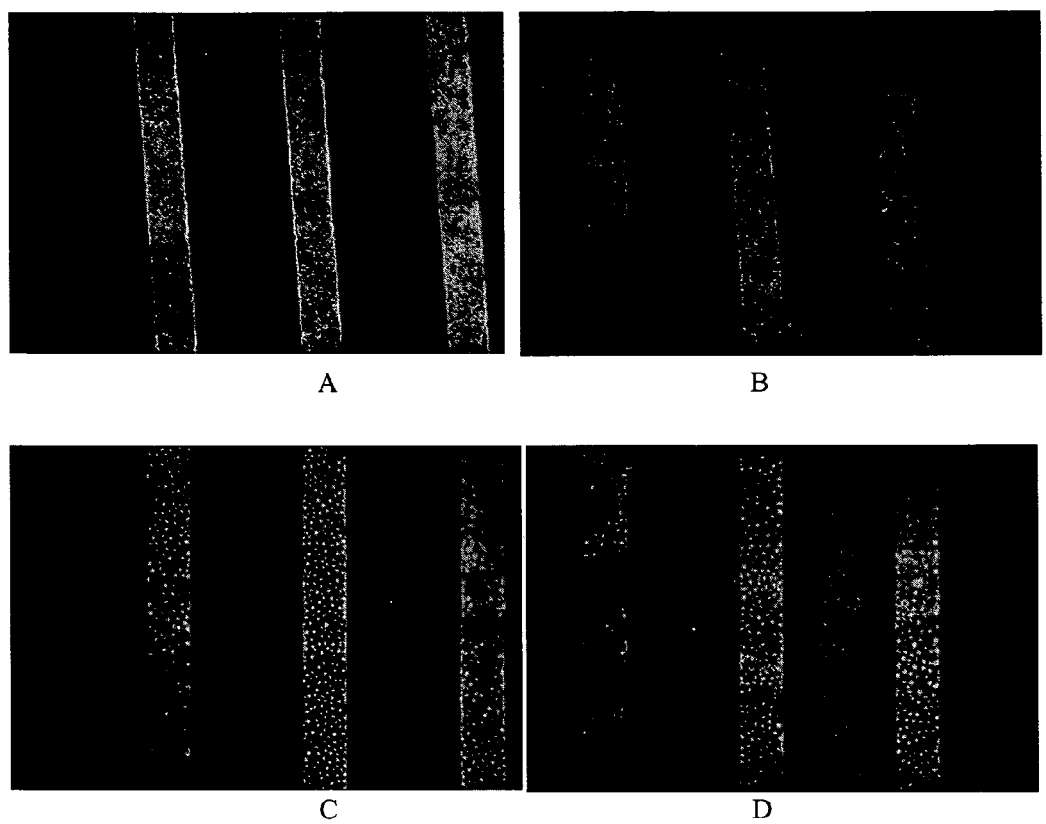
FIG. 3 demonstrates the formation of a complement of a master, and its reproduction in which thiolated DNA patterns of parallel lines of two different DNA sequences formed on the master.
Figure 4:
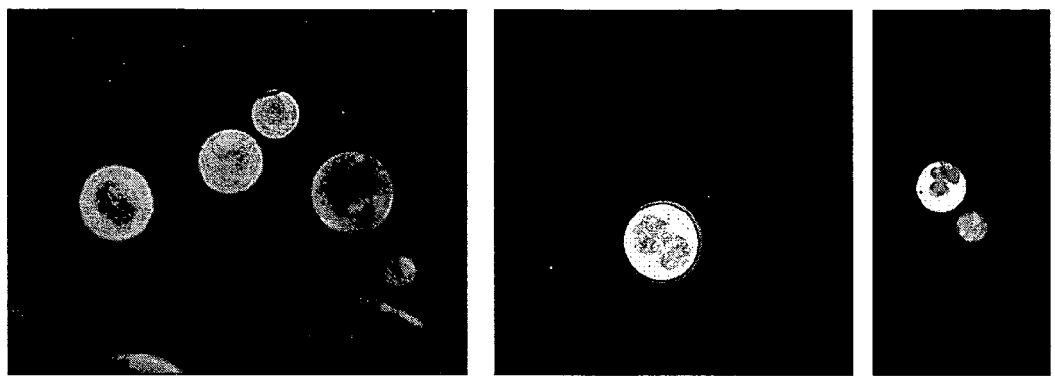
FIG. 4 demonstrates the formation of a complement of a master, and its reproduction in which DNA patterns were created on the master via use of the TIPS® system.

Complement Formation and Reproduction of a Master Comprising Multiple DNA Species FIG. 3 shows the result of an embodiment of the methods of this invention. In this embodiment, a master with 6 lines composed of two different kinds of DNA molecules (thiol-C6-A, thiol-C6-B) was fabricated as described, and cDNA (Acrydite-12T-A' and amine —C12-B') was hybridized. The complement was printed on PDMS through LiSuNS followed by hybridization with the original sequenced DNA modified with Rhodamine Red (sequence A) and Rhodamine Green (sequence B) to form the reproduction of the respective master sequence.

Example 4

Complement Formation and Reproduction of a Master Formed via TIPS

Several masters were fabricated on gold substrates using the TIPS® system (Hewlett-Packard). The HP Thermal Inkjet pico-fluidic drop dispense system (TIPS) system dispenses liquids in pico-liter sized quantities by controlling the pressure and the nozzle size. Using the TIPS system, a 70 μM solution of primary DNA molecules was dropped on a gold-on-glass substrate. The size range of resulting DNA dots formed on the substrate was 20 μm~100 μm. After incubating the fabricated master in a humid chamber for 5 days to allow for formation of a DNA monolayer on the surface of the master, the master was exposed to 1 mM 6-mercapto-1-hexanol aqueous solution for 1 hr to minimize nonspecific adsorption of single-stranded DNA, then rinsed with water 5 times and air-dried. The master was then exposed to a 2 μM solution of the secondary DNA for 2 hours so that hybridization occurred.

Complementary patterns were printed through LiSuNS, via hybridization to cDNA [A': 5' acrydite-C6-(TTT TTT TTT TTT) CCA GGA TTT TCA TGA GGG GCC GTA GCT TGA GCC ACC ACT GTT CTT GGA GA-3' (SEQ ID NO: 9)], and attachment to the prepolymer of PDMS, as described. The complement was then hybridized to DNA with sequences corresponding to that of the original, wherein the DNA comprised terminal fluorescent tags [Rhodamine Red]. Fluorescence images seen represent printed dots, visualized at three different areas in one complement.

What is claimed is:

1. A method of forming a complement of a master, said method comprising the steps of:
   a) contacting a master comprising a first set of molecules bound to a first substrate with a second set of molecules, wherein each molecule in said second set of molecules comprises:
      i) a spacer fragment;
      ii) a recognition component that is attracted to or binds to one or more of the first set of molecules, or a fragment thereof, wherein said recognition component is attached to said spacer fragment;
   b) contacting said spacer fragment of said second set of molecules with a prepolymer;
   c) polymerizing said prepolymer in (b) to form a second substrate; and
   d) breaking the attractive force or bonds formed between said first set of molecules and said second set of molecules;
   thereby forming a complement of the master.

2. The method of claim 1, wherein said spacer fragment comprises a terminally located reactive functional group, which contacts said prepolymer.

3. The method of claim 1, wherein said first set of molecules, said second set of molecules or a combination thereof comprise nucleic acids.

4. The method of claim 3, wherein said first set of molecules and said second set of molecules comprise nucleic acids.

5. The method of claim 4, wherein said recognition component comprises a nucleic acid with a sequence complementary to that of said first set of molecules, or a fragment thereof.

6. The method of claim 4, wherein said spacer fragment comprises a string of nucleotides having no complementary sequence in said first set of molecules.

7. The method of claim 3, wherein said spacer fragment ranges in size from about 1-100 nucleotides in length.

8. The method of claim 1, wherein said prepolymer comprises a photopolymerizable polymer.

9. The method of claim 8, wherein said prepolymer comprises an acrylate, diacrylate, oligoacrylate, methacrylate, dimethacrylate, oligomethacrylate, cinnamate, dicinnamate, oligocinnamate, or a combination thereof.

10. The method of claim 8, further comprising the addition of a photoinitiator or organic initiator in step (c).

11. The method of claim 8, wherein said prepolymer comprises poly (dimethylsiloxane) or a polyurethane based UV curable polymer.

12. The method of claim 2, wherein said reactive functional group comprises a terminally located amine, acrydite, aldehyde or thiol group.

13. The method of claim 1, wherein breaking said attractive force or bonds formed between said first set of molecules and said second set of molecules is accomplished at a specific temperature.

14. The method of claim 13, wherein said prepolymer polymerizes at a temperature that is less than said specific temperature.

15. A kit for the formation of a complement of a master comprising:
  a) a master comprising a first set of molecules bound to a first substrate
  b) a second set of molecules, wherein each molecule in said second set of molecules comprises:
    i)) a spacer fragment;
    ii) a recognition component that is attracted to or binds to one or more of the first set of molecules, or a fragment thereof, wherein said recognition component is attached to said spacer fragment;
  c) a prepolymer; and
  d) optionally, agents for initiating or enhancing polymerization of said prepolymer
  whereby attachment of said second set of molecules to said prepolymer, polymerization of said prepolymer to form a second substrate and breaking of attractive force or bonds formed between said first set of molecules or a fragment thereof and said second set of molecules forms a complement of the master.

16. The kit of claim 15, wherein said spacer fragment comprises a terminally located reactive functional group, which contacts said prepolymer.

17. The kit of claim 15, wherein said first set of molecules, said second set of molecules or a combination thereof comprise nucleic acids.

18. The kit of claim 17, wherein said first set of molecules and said second set of molecules comprise nucleic acids.

19. The kit of claim 17, wherein said recognition component comprises a nucleic acid with a sequence complementary to that of said first set of molecules or a fragment thereof.

20. The kit of claim 17, wherein said spacer fragment comprises a string of nucleotides having no complementary sequence in said first set of molecules.

21. The kit of claim 17, wherein said spacer fragment ranges in size from about 1-100 nucleotides in length.

22. The kit of claim 15, wherein said prepolymer comprises comprises a photopolymerizable polymer.

23. The kit of claim 15, wherein said prepolymer comprises an acrylate, diacrylate, oligoacrylate, methacrylate, dimethacrylate, oligomethacrylate, cinnamate, dicinnamate, oligocinnamate, or a combination thereof.

24. The kit of claim 15, further comprising a photoinitiator or organic initiator.

25. The kit of claim 15, wherein said prepolymer comprises poly (dimethylsiloxane) or a polyurethane based UV curable polymer.

26. The kit of claim 16, wherein said reactive functional group comprises a terminally located amine, acrydite, aldehyde or thiol group.

27. The kit of claim 15, further comprising a first substrate and reagents for attaching said first set of molecules to said first substrate to create said master.

28. The kit of claim 15, wherein breaking said attractive force or bonds formed between said first set of molecules and said second set of molecules is accomplished at a specific temperature.

29. The kit of claim 28, comprising a prepolymer, which polymerizes at a temperature that is less than said specific temperature.

30. A method of forming a reproduction of a master, or portion thereof, comprising the steps of:
  a) contacting a master comprising a first set of molecules bound to a first substrate with a second set of molecules, wherein each molecule in said second set of molecules comprises:
    i) a spacer fragment;
    ii) a recognition component that is attracted to or binds to one or more of the first set of molecules, or a fragment thereof, wherein said recognition component is attached to said spacer fragment;
  b) contacting said spacer fragment of said second set of molecules with a prepolymer;
  c) polymerizing said prepolymer in (b) to form a second substrate;
  d) breaking the attractive force or bonds formed between said first set of molecules or a fragment thereof and said second set of molecules
  e) assembling via bond formation a third set of molecules on said second set of molecules of the complement image, wherein each molecule in the third set of molecules comprises:
    i) a spacer fragment;
    ii) a recognition component that is attracted to or binds to one or more of the second set of molecules, or a fragment thereof, wherein said recognition component is attached to said spacer fragment;
  f) contacting said spacer fragment of said third set of molecules with a prepolymer;
  g) polymerizing said prepolymer in f) to form a third substrate; and
  h) breaking the attractive force or bonds formed between said second set of molecules or a fragment thereof and said third set of molecules;
  whereby attachment of said second set of molecules to said prepolymer, polymerization of said prepolymer to form a second substrate and breaking of attractive force or bonds formed between said first set of molecules or a fragment thereof and said second set of molecules forms a complement of the master and attachment of said third set of molecules to said prepolymer, polymerization of said prepolymer to form a third substrate and breaking of attractive force or bonds formed between said second set of molecules or a fragment thereof and said third set of molecules forms a reproduction of the master.

31. The method of claim 30, wherein said spacer fragment comprises a terminally located reactive functional group, which contacts said prepolymer.

32. The method of claim 30, wherein said first set of molecules, said second set of molecules, said third set of molecules or a combination thereof comprise nucleic acids.

33. The method of claim 32, wherein said recognition component comprises a nucleic acid with a sequence complementary to that of said first or second set of molecules, or fragments thereof.

34. The method of claim 32, wherein said spacer fragment comprises a string of nucleotides having no complementary sequence in said first or second set of molecules.

35. The method of claim 32, wherein said spacer fragment ranges in size from about 1-100 nucleotides in length.

36. The method of claim 30, wherein said prepolymer comprises comprises a photopolymerizable polymer.

37. The method of claim 30, wherein said prepolymer comprises an acrylate, diacrylate, oligoacrylate, methacrylate, dimethacrylate, oligomethacrylate, cinnamate, dicinnamate, oligocinnamate, or a combination thereof.

38. The method of claim 30, further comprising the addition of a photoinitiator or organic initiator in step (c) or (e).

39. The method of claim 30, wherein said prepolymer comprises poly (dimethylsiloxane) or a polyurethane based UV curable polymer.

40. The method of claim 31, wherein said reactive functional group comprises a terminally located amine, acrydite, aldehyde or thiol group.

41. The method of claim 30, wherein breaking said attractive force or bonds formed between said first set of molecules and said second set of molecules, or said second set of molecules and said third set of molecules, or a combination thereof, is accomplished at a specific temperature.

42. The method of claim 41, wherein said prepolymer polymerizes at a temperature that is less than said specific temperature.

43. A kit for the reproduction of a master comprising:
a) a master comprising a first set of molecules bound to a first substrate
b) a second set of molecules, wherein each molecule in said second set of molecules comprises:
   i) a spacer fragment;
   ii) a recognition component that is attracted to or binds to one or more of the first set of molecules, or a fragment thereof, wherein said recognition component is attached to said spacer fragment;
c) a third set of molecules, wherein each molecule in the third set of molecules comprises:
   i) a spacer fragment;
   ii) a recognition component that is attracted to or binds to one or more of the first set of molecules, or a fragment thereof, wherein said recognition component is attached to said spacer fragment;
d) at least one prepolymer; and
f) optionally, agents for initiating or enhancing polymerization of said prepolymer
whereby attachment of said second set of molecules to said prepolymer, polymerization of said prepolymer to form a second substrate and breaking of attractive force or bonds formed between said first set of molecules or a fragment thereof and said second set of molecules forms a complement of the master and attachment of said third set of molecules to said prepolymer, polymerization of said prepolymer to form a third substrate and breaking of attractive force or bonds formed between said second set of molecules or a fragment thereof and said third set of molecules forms a reproduction of the master.

44. The kit of claim 43, wherein said spacer fragment comprises a terminally located reactive functional group, which contacts said prepolymer.

45. The kit of claim 43, wherein said first or second or third set of molecules, or a combination thereof comprise nucleic acids.

46. The kit of claim 45, wherein said first and second and third set of molecules comprise nucleic acids.

47. The kit of claim 45, wherein said recognition component comprises a nucleic acid with a sequence complementary to that of said first or second set of molecules, or fragments thereof.

48. The kit of claim 45, wherein said spacer fragment comprises a string of nucleotides having no complementary sequence in said first or second set of molecules.

49. The kit of claim 48, wherein said spacer fragment ranges in size from about 1-100 nucleotides in length.

50. The kit of claim 43, wherein said prepolymer comprises comprises a photopolymerizable polymer.

51. The kit of claim 43, wherein said prepolymer comprises an acrylate, diacrylate, oligoacrylate, methacrylate, dimethacrylate, oligomethacrylate, cinnamate, dicinnamate, oligocinnamate, or a combination thereof.

52. The kit of claim 43, further comprising a photoinitiator or organic initiator.

53. The kit of claim 43, wherein said prepolymer comprises poly (dimethylsiloxane) or a polyurethane based UV curable polymer.

54. The kit of claim 44, wherein said reactive functional group comprises a terminally located amine, acrydite, aldehyde or thiol group.

55. The kit of claim 43, further comprising a first substrate and reagents for attaching said first set of molecules to said first substrate to create said master.

56. The kit of claim 43, wherein breaking said attractive force or bonds formed between said first set of molecules and said second set of molecules is accomplished at a specific temperature.

57. The kit of claim 56, comprising a prepolymer, which polymerizes at a temperature that is less than said specific temperature.

* * * * *

```
                         SEQUENCE LISTING

<160> NUMBER OF SEQ ID NOS: 9

<210> SEQ ID NO 1
<211> LENGTH: 50
<212> TYPE: DNA
<213> ORGANISM: Artificial Sequence
<220> FEATURE:
<223> OTHER INFORMATION: Thiolated DNA

<400> SEQUENCE: 1
tcccaaagaa cagtggtggc tcaagctacg gcccctcatg aaaatcctgg          50

<210> SEQ ID NO 2
<211> LENGTH: 62
<212> TYPE: DNA
<213> ORGANISM: Artificial Sequence
<220> FEATURE:
<223> OTHER INFORMATION: Acrydite-functionalized cDNA

<400> SEQUENCE: 2 ttttttttttt ttccaggatt ttcatgaggg gccgtagctt gagccaccac tgttctttgg   60
ga                                                              62

<210> SEQ ID NO 3
<211> LENGTH: 50
<212> TYPE: DNA
<213> ORGANISM: Artificial Sequence
<220> FEATURE:
<223> OTHER INFORMATION: Thiol-C6-A

<400> SEQUENCE: 3
tcccaaagaa cagtggtggc tcaagctacg gcccctcatg aaaatcctgg          50

<210> SEQ ID NO 4
<211> LENGTH: 50
<212> TYPE: DNA
<213> ORGANISM: Artificial Sequence
<220> FEATURE:
<223> OTHER INFORMATION: Thiol-C6-B

<400> SEQUENCE: 4
ccctcagccc tcgccatcat ggaaaatgcc aatgttctgg cccgttatgc          50

<210> SEQ ID NO 5
<211> LENGTH: 62
<212> TYPE: DNA
<213> ORGANISM: Artificial Sequence
<220> FEATURE:
<223> OTHER INFORMATION: Acrydite-functionalized cDNA molecule

<400> SEQUENCE: 5 ttttttttttt ttccaggatt ttcatgaggg gccgtagctt gagccaccac tgttctttgg   60
ga                                                              62

<210> SEQ ID NO 6
<211> LENGTH: 62
<212> TYPE: DNA
<213> ORGANISM: Artificial Sequence
```

```
<220> FEATURE:
<223> OTHER INFORMATION: Acrydite-functionalized cDNA molecule

<400> SEQUENCE: 6
tttttttttt ttgcataacg ggccagaaca ttggcatttt ccatgatggc gagggctgag      60
gg                                                                     62

<210> SEQ ID NO 7
<211> LENGTH: 50
<212> TYPE: DNA
<213> ORGANISM: Artificial Sequence
<220> FEATURE:
<223> OTHER INFORMATION: Thiol-C6-A modified with Rhodamine Red

<400> SEQUENCE: 7
tcccaaagaa cagtggtggc tcaagctacg gccctcatg aaaatcctgg                  50

<210> SEQ ID NO 8
<211> LENGTH: 50
<212> TYPE: DNA
<213> ORGANISM: Artificial Sequence
<220> FEATURE:
<223> OTHER INFORMATION: Thiol-C6-B modified with Rhodamine Green

<400> SEQUENCE: 8
ccctcagccc tcgccatcat ggaaaatgcc aatgttctgg cccgttatgc                 50

<210> SEQ ID NO 9
<211> LENGTH: 62
<212> TYPE: DNA
<213> ORGANISM: Artificial Sequence
<220> FEATURE:
<223> OTHER INFORMATION: cDNA

<400> SEQUENCE: 9
tttttttttt ttccaggatt ttcatgaggg gccgtagctt gagccaccac tgttctttgg      60
ga                                                                     62
```